(12) United States Patent
Niwa et al.

(10) Patent No.: US 11,489,091 B2
(45) Date of Patent: Nov. 1, 2022

(54) SEMICONDUCTOR LIGHT EMITTING DEVICE AND METHOD OF MANUFACTURING SEMICONDUCTOR LIGHT EMITTING DEVICE HAVING PATTERED LIGHT EXTRACTION SURFACE

(71) Applicants: NIKKISO CO., LTD., Tokyo (JP); SCIVAX Corporation, Kawasaki (JP)

(72) Inventors: Noritaka Niwa, Hakusan (JP); Tetsuhiko Inazu, Hakusan (JP); Yasumasa Suzaki, Kawasaki (JP); Akifumi Nawata, Kawasaki (JP); Satoru Tanaka, Kawasaki (JP)

(73) Assignees: NIKKISO CO., LTD., Tokyo (JP); SCIVAX CORPORATION, Kawasaki (JP)

( * ) Notice: Subject to any disclaimer, the term of this patent is extended or adjusted under 35 U.S.C. 154(b) by 406 days.

(21) Appl. No.: 16/370,791

(22) Filed: Mar. 29, 2019

(65) Prior Publication Data
US 2019/0229238 A1    Jul. 25, 2019

Related U.S. Application Data

(63) Continuation of application No. PCT/JP2017/035022, filed on Sep. 27, 2017.

(30) Foreign Application Priority Data

Sep. 30, 2016    (JP) .............................. JP2016-194153

(51) Int. Cl.
*H01L 33/32*        (2010.01)
*H01L 33/22*        (2010.01)
(Continued)

(52) U.S. Cl.
CPC .......... *H01L 33/32* (2013.01); *H01L 21/3065* (2013.01); *H01L 33/007* (2013.01); *H01L 33/22* (2013.01); *H01L 33/40* (2013.01)

(58) Field of Classification Search
CPC ...... H01L 33/22; H01L 21/3065; H01L 33/32
See application file for complete search history.

(56) References Cited

U.S. PATENT DOCUMENTS

| 7,759,682 | B2 * | 7/2010 | Saxler | ..................... H01L 33/22 |
| | | | | 257/79 |
| 2010/0032647 | A1 * | 2/2010 | Khan | ..................... H01L 33/32 |
| | | | | 257/13 |

(Continued)

FOREIGN PATENT DOCUMENTS

| CN | 102130285 A | 7/2011 |
| CN | 103400908 A | 11/2013 |

(Continued)

OTHER PUBLICATIONS

Office Action dated Apr. 24, 2020 in Korean Application No. 10-2019-7012424 (w/English-language translation).

(Continued)

*Primary Examiner* — Matthew C Landau
*Assistant Examiner* — Mark Hatzilambrou
(74) *Attorney, Agent, or Firm* — Muncy, Geissler, Olds & Lowe, P.C.

(57) ABSTRACT

A semiconductor light emitting device includes a light extraction layer having a light extraction surface. The light extraction layer includes: a plurality of cone-shaped parts formed in an array on the light extraction surface, and a plurality of granular parts formed both on a side part of the cone-shaped part and in a space between adjacent cone-shaped parts. A method of manufacturing the semiconductor light emitting device includes: forming a mask having an array pattern on the light extraction layer; and etching the (Continued)

mask and the light extraction layer from above the mask. The etching includes first dry-etching performed until an entirety of the mask is removed and second dry-etching performed to further dry-etch the light extraction layer after the mask is removed.

7 Claims, 10 Drawing Sheets

(51) Int. Cl.
*H01L 33/00* (2010.01)
*H01L 21/3065* (2006.01)
*H01L 33/40* (2010.01)

(56) References Cited

U.S. PATENT DOCUMENTS

| | | | |
|---|---|---|---|
| 2010/0072501 | A1 | 3/2010 | Wakai et al. |
| 2011/0076791 | A1 | 3/2011 | Wu et al. |
| 2011/0108956 | A1 | 5/2011 | Haase et al. |
| 2013/0119424 | A1 | 5/2013 | Kang et al. |
| 2013/0214245 | A1 | 8/2013 | Chang et al. |
| 2014/0103391 | A1* | 4/2014 | Haruta ............... H01L 33/0075 257/103 |
| 2015/0014702 | A1 | 11/2015 | Lee et al. |
| 2016/0163937 | A1 | 6/2016 | Inoue et al. |

FOREIGN PATENT DOCUMENTS

| | | |
|---|---|---|
| CN | 104425666 A | 3/2015 |
| EP | 2408025 A1 | 1/2012 |
| EP | 2595204 A2 | 5/2013 |
| EP | 3026716 A1 | 6/2016 |
| JP | 2007-123446 A | 5/2007 |
| JP | 2008-060286 A | 3/2008 |
| JP | 2010-074008 A | 4/2010 |
| JP | 2012-124257 A | 6/2012 |
| JP | 5594530 B | 8/2014 |
| WO | WO2015016150 A1 | 2/2015 |
| WO | WO2015053363 A1 | 4/2015 |

OTHER PUBLICATIONS

Office Action dated Dec. 4, 2020 in CN Application No. 20170060220. 5, 15 pages.
Office Action dated Jan. 25, 2021 in TW Application No. 106133724, 11 pages.
International Search Report dated Dec. 5, 2017, in International Application No. PCT/JP2017/035022, 5 pages.
International Searching Authority Written Opinion of the International Searching Authority dated May 12, 2017, in International Application No. PCT/JP2017/035022, 11 pages.
International Preliminary Report on Patentability Chapter II in International Application No. PCT/JP2017/035022, 12 pages.
Pernot, Cyril et al., "Improved Efficiency of 255-280 nm AlGaN-Based Light-Emitting Diodes", Applied Physics Express 3 (2010) 061004.
Office Action, with English translation, issued in corresponding CN application No. 201780060220.5. dated Jun. 30, 2021 (9 pages).
Office Action dated Apr. 7, 2022 in CN Application No. 201780060220. 5, 12 pages, w/English-language translation.

* cited by examiner

SEMICONDUCTOR LIGHT EMITTING DEVICE AND METHOD OF MANUFACTURING SEMICONDUCTOR LIGHT EMITTING DEVICE HAVING PATTERED LIGHT EXTRACTION SURFACE

RELATED APPLICATION

The present application is a Continuation of co-pending International PCT Application No. PCT/JP2017/035022 filed on Sep. 27, 2017, for which priority is claimed under 35 U.S.C. § 120; and this application claims priority of Application No. 2016-194153 filed in Japan on Sep. 30, 2016; the entire contents of all of which are hereby incorporated by reference.

BACKGROUND OF THE INVENTION

1. Field of the Invention

The present invention relates to semiconductor light emitting devices.

2. Description of the Related Art

Nowadays, semiconductor light emitting devices such as light emitting diodes and laser diodes that emit blue light have been in practical use. Development of light emitting devices that output deep ultraviolet light having a shorter wavelength has also been pursued. Deep ultraviolet light has sterilization capability. Semiconductor light emitting devices capable of outputting deep ultraviolet light have attracted attention as a mercury free sterilization light source in medical and food processing fronts.

A light emitting device for emitting deep ultraviolet light includes an aluminum gallium nitride (AlGaN) based n-type clad layer, active layer, p-type clad layer, etc. stacked successively on a substrate, and the deep ultraviolet light emitted by the active layer is output from a light extraction surface of the substrate.

It is known that the external quantum efficiency of deep ultraviolet light output via the light extraction surface of the substrate of a deep ultraviolet light emitting device is as low as several % and that the shorter the wavelength of emitted light, the lower the external quantum efficiency.

SUMMARY OF THE INVENTION

In this background, one illustrative purpose of the present invention is to provide a technology of increasing the light extraction efficiency of semiconductor light emitting devices.

A semiconductor light emitting device according to an embodiment includes a light extraction layer having a light extraction surface, wherein the light extraction layer includes: a plurality of cone-shaped parts formed in an array on the light extraction surface, and a plurality of granular parts formed both on a side part of the cone-shaped part and in a space between adjacent cone-shaped parts.

According to the embodiment, total reflection of light produced inside the light extraction layer is inhibited and the efficiency of light extraction from the light extraction surface is increased, by forming an array of a plurality of cone-shaped parts on the light extraction surface to provide an asperity structure. Further, the effect of inhibiting total reflection is further enhanced by forming fine granular parts both on the side part of the plurality of cone-shaped parts and on the flat part located in a space between adjacent cone-shaped parts. According to the embodiment, the light extraction efficiency is further improved by forming an asperity structure including a combination of cone-shaped parts and granular parts on the light extraction surface.

An angle of inclination of the side part of the cone-shaped part may be smaller near an apex of the cone-shaped part than near a bottom of the cone-shaped part.

A proportion occupied by the plurality of cone-shaped parts may be not less than 70% and not more than 85% of an area in a plan view of the light extraction surface.

A diameter of a bottom of the cone-shaped part may be not less than 100 nm and not more than 1000 nm, and a diameter of the granular part may be not less than 10 nm and not more than 90 nm.

The semiconductor light emitting device may include: a baes structure that includes at least one of a sapphire ($Al_2O_3$) layer and an aluminum nitride (AlN) layer; and a light emitting structure that is formed on the base structure and includes an aluminum gallium nitride (AlGaN)-based semiconductor layer for emitting deep ultraviolet light. The light extraction layer may be the sapphire layer, the AlN layer, or a silicon oxide ($SiO_2$) layer of the base structure.

Another embodiment of the present invention relates to a method of manufacturing a semiconductor light emitting device. The method is directed to manufacturing of a semiconductor light emitting device including a light extraction surface having a light extraction surface and includes: forming a mask having an array pattern on the light extraction layer; and etching the mask and the light extraction layer from above the mask. The dry-etching includes first dry-etching performed until an entirety of the mask is removed and second dry-etching performed to further dry-etch the light extraction layer after the mask is removed.

According to the embodiment, an array of a plurality of cone-shaped parts are formed in the first dry-etching step, and, in the second dry-etching step, fine granular parts are formed both on the side part of the cone-shaped parts and on the flat part located in a space between adjacent cone-shaped parts. In other words, an asperity structure including a combination of cone-shaped parts and granular parts is formed in a dry-etching step using one mask. According to the embodiment, there is no need to prepare separate masks or etching steps to form cone-shaped parts and granular parts and the light extraction surface with enhanced light extraction efficiency is manufactured easily.

A second etching volume in a direction of depth by which the light extraction layer is etched in the second dry-etching may be not less than 10% and not more than 20% a first etching volume in the direction of depth by which the light extraction layer is etched in the first dry-etching.

An etching rate of the second dry-etching may be the same as that of the first dry-etching, and a second dry-etching time for which the second dry-etching is performed may be not less than 10% and not more than 20% a first dry-etching time for which the first dry-etching is performed.

The semiconductor light emitting device may include: a baes structure that includes at least one of a sapphire ($Al_2O_3$) layer and an aluminum nitride (AlN) layer; and a light emitting structure that is formed on the base structure and includes an aluminum gallium nitride (AlGaN)-based semiconductor layer for emitting deep ultraviolet light. The light extraction layer may be the sapphire layer, the AlN layer, or a silicon oxide ($SiO_2$) layer of the base structure.

Chlorine ($Cl_2$) or boron trichloride ($BCl_3$) may be used as an etching gas in the dry-etching.

The mask may be made of a resin.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
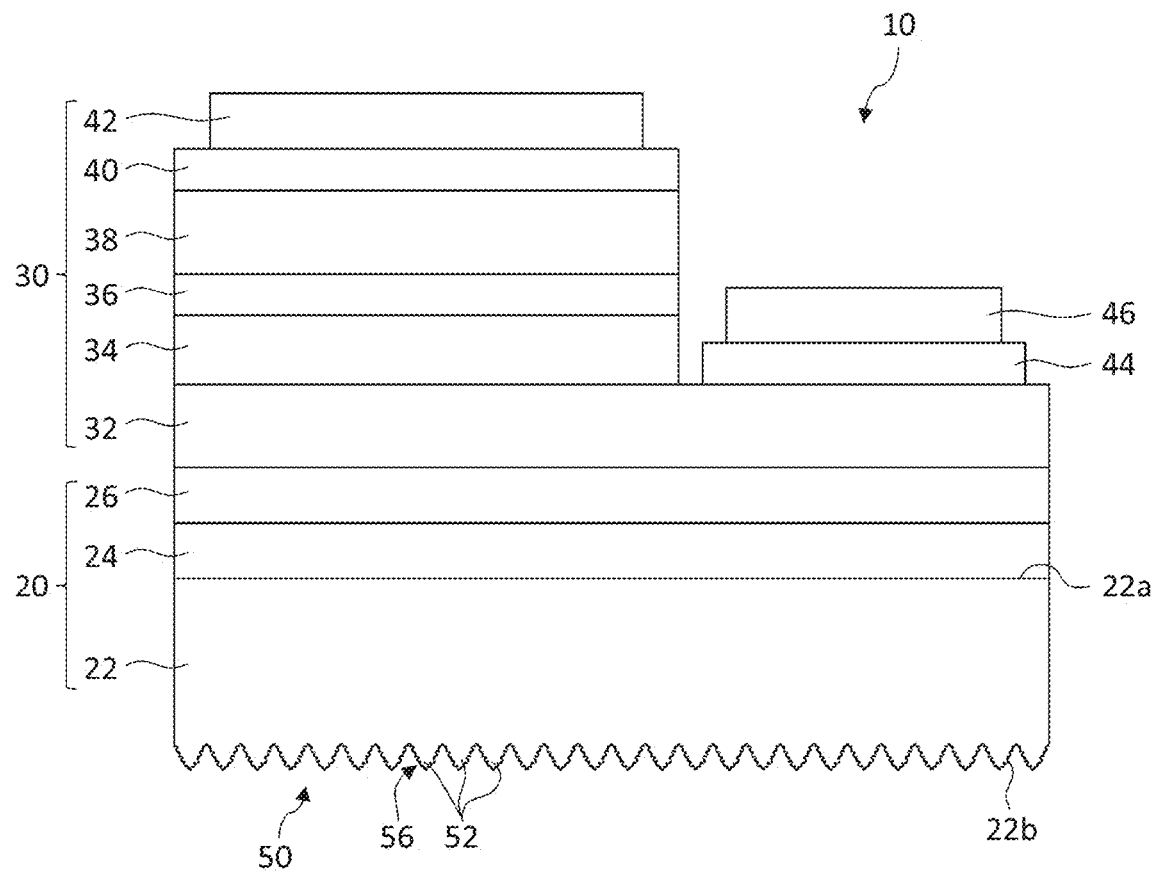
FIG. 1 is a cross sectional view schematically showing a configuration of a semiconductor light emitting device according to the embodiment.

The invention will now be described by reference to the preferred embodiments. This does not intend to limit the scope of the present invention, but to exemplify the invention.

A detailed description will be given of embodiments of the present invention with reference to the drawings. Like numerals are used in the description to denote like elements and a duplicate description is omitted as appropriate. To facilitate the understanding, the relative dimensions of the constituting elements in the drawings do not necessarily mirror the relative dimensions in the actual apparatus.

FIG. 1 is a cross sectional view schematically showing a configuration of a semiconductor light emitting device 10 according to the embodiment. The semiconductor light emitting device 10 includes a base structure 20 and a light emitting structure 30. The base structure 20 includes a substrate 22, a first base layer 24, and a second base layer 26. The light emitting structure 30 includes an n-type clad layer 32, an active layer 34, an electron block layer 36, a p-type clad layer 38, a p-type contact layer 40, a p-side electrode 42, an n-type contact layer 44, and an n-side electrode 46.

The semiconductor light emitting device 10 is a semiconductor light emitting device configured to emit "deep ultraviolet light" having a central wavelength of about 365 nm or shorter. To output deep ultraviolet light having such a wavelength, the active layer 34 is made of an aluminum gallium nitride (AlGaN)-based semiconductor material having a band gap of about 3.4 eV or larger. In this embodiment, the case of emitting deep ultraviolet light having a central wavelength of about 280 nm is specifically discussed.

In this specification, the term "AlGaN-based semiconductor material" mainly refers to a semiconductor material containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \leq x+y \leq 1$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The substrate 22 is a sapphire ($Al_2O_3$) substrate. The substrate 22 may be an aluminum nitride (AlN) substrate in one variation. The substrate 22 includes a first principal surface 22a and a second principal surface 22b opposite to the first principal surface 22a. The first principal surface 22a is a principal surface that is a crystal growth surface. For example, the first principal surface 22a is the (0001) plane of the sapphire substrate. The second principal surface 22b is a principal surface that is the light extraction surface and is formed with a micro-asperity structure (texture structure) 50 of a submicron scale. The detail of the asperity structure 50 will be described later. The first base layer 24 and the second base layer 26 are stacked on the first principal surface 22a of the substrate 22. The first base layer 24 is a layer made of an AlN-based semiconductor material and is, for example, an AlN (HT-AlN) layer gown at a high temperature. The second base layer 26 is a layer made of an AlGaN-based semiconductor material and is, for example, an undoped AlGaN(u-AlGaN) layer.

The substrate 22, the first base layer 24, and the second base layer 26 function as a foundation layer (template) to form the n-type clad layer 32 and the layers above. These layers also function as a light extraction layer for extracting the deep ultraviolet light emitted by the active layer 34 outside and transmit the deep ultraviolet light emitted by the active layer 34. It is preferred that the first base layer 24 and the second base layer 26 be made of an AlGaN-based or AlN-based material having an AlN ratio higher than that of the active layer 34 so as to increase the transmittance for the deep ultraviolet light emitted by the active layer 34. It is further preferred that the first base layer 24 and the second base layer 26 be made of a material having a lower refractive index than the active layer 34. It is also preferred that the first base layer 24 and the second base layer 26 be made of a material having a higher refractive index than the substrate 22. Given that the substrate 22 is a sapphire substrate (the refractive index $n_1$=about 1.8) and the active layer 34 is a made of an AlGaN-based semiconductor material (the refractive index $n_3$=about 2.4~2.6), for example, it is preferred that the first base layer 24 and the second base layer 26 be made of an AlN layer (the refractive index $n_2$=about 2.1) or an AlGaN-based semiconductor material (the refractive index $n_2$=about 2.2~2.3) having a relatively higher AlN composition ratio.

The n-type clad layer 32 is an n-type semiconductor layer provided on the second base layer 26. The n-type clad layer 32 is made of an n-type AlGaN-based semiconductor material. For example, the n-type clad layer 32 is an AlGaN layer doped with silicon (Si) as an n-type impurity. The composition ratio of the n-type clad layer 32 is selected to transmit the deep ultraviolet light emitted by the active layer 34. For example, the n-type clad layer 32 is formed such that the molar fraction of AlN is 40% or higher, and, preferably, 50% or higher. The n-type clad layer 32 has a band gap larger than the wavelength of the deep ultraviolet light emitted by the active layer 34. For example, the n-type clad layer 32 is formed to have a band gap of 4.3 eV or larger. The n-type clad layer 32 has a thickness of about 100 nm~300 nm. For example, the n-type clad layer 32 has a thickness of about 200 nm.

The active layer 34 is formed in a partial region on the n-type clad layer 32. The active layer 34 is made of an AlGaN-based semiconductor material and has a double heterojunction structure by being sandwiched by the n-type clad layer 32 and the electron block layer 36. The active layer 34 may form a monolayer or multilayer quantum well structure. The quantum well structure like this is formed by, for example, building a stack of a barrier layer made of an n-type AlGaN-based semiconductor material and a well layer made of an undoped AlGaN-based semiconductor material. To output deep ultraviolet light having a wavelength of 355 nm or shorter, the active layer 34 is formed to have a band gap of 3.4 eV or larger. For example, the AlN composition ratio of the active layer 34 is selected so as to output deep ultraviolet light having a wavelength of 310 nm or shorter.

The electron block layer 36 is formed on the active layer 34. The electron block layer 36 is made of a p-type AlGaN-based semiconductor material. For example, the electron block layer 36 is an AlGaN layer doped with magnesium (Mg) as a p-type impurity. The electron block layer 36 is formed such that the molar fraction of AlN is 40% or higher, and, preferably, 50% or higher. The electron block layer 36 may be formed such that the molar fraction of AlN is 80% or higher or may be made of an AlN-based semiconductor material that does not substantially contain GaN. The electron block layer 36 has a thickness of about 1 nm 10 nm. For example, the electron block layer 36 has a thickness of about 2 nm~5 nm.

The p-type clad layer 38 is formed on the electron block layer 36. The p-type clad layer 38 is a layer made of a p-type AlGaN-based semiconductor material and is exemplified by a Mg-doped AlGaN layer. The composition ratio of the p-type clad layer 38 is selected such that the molar fraction of AlN in the p-type clad layer 38 is lower than that of the electron block layer 36. The p-type clad layer 38 has a thickness of about 300 nm~700 nm. For example, the p-type clad layer 38 has a thickness of about 400 nm~600 nm.

The p-type contact layer 40 is formed on the p-type clad layer 38. The p-type contact layer 40 is made of a p-type AlGaN-based semiconductor material, and the composition ratio of the p-type contact layer 40 is selected such that the Al content percentage thereof is lower than that of the electron block layer 36 or the p-type clad layer 38. It is preferable that the molar fraction of AlN in the p-type contact layer 40 is 20% or lower, and it is more preferable that the molar fraction of AlN is 10% or lower. The p-type contact layer 40 may be made of a p-type GaN-based semiconductor material that does not substantially contain AlN. By configuring the molar fraction of AlN in the p-type contact layer 40 to be small, proper ohmic contact with the p-side electrode 42 is obtained. The small AlN molar fraction can also reduce the bulk resistance of the p-type contact layer 40 and improve the efficiency of injecting carriers into the active layer 34.

The p-side electrode 42 is provided on the p-type contact layer 40. The p-side electrode 42 is made of a material capable of establishing ohmic contact with the p-type contact layer 40. For example, the p-side electrode 42 is formed by a nickel (Ni)/gold (Au) stack structure. For example, the thickness of the Ni layer is about 60 nm, and the thickness of the Au layer is about 50 nm.

The n-type contact layer 44 is provided in an exposed region on the n-type clad layer 32 where the active layer 34 is not provided. The n-type contact layer 44 may be made of an AlGaN-based semiconductor material or a GaN-based semiconductor material of an n-type having a composition ratio selected such that the Al content percentage thereof is lower than that of the n-type clad layer 32. It is preferable that the molar fraction of AlN in the n-type contact layer is 20% or lower, and it is more preferable that the molar fraction of AlN is 10% or lower.

The n-side electrode 46 is provided on the n-type contact layer 44. For example, the n-side electrode 46 is formed by a titanium (Ti)/Al/Ti/Au stack structure. For example, the thickness of the first Ti layer is about 20 nm, the thickness of the Al layer is about 100 nm, the thickness of the second Ti layer is about 50 nm, and the thickness of the Au layer is about 100 nm.

The asperity structure 50 is formed on the second principal surface (also referred to as the light extraction surface) 22b of the substrate 22 that is the light extraction layer. The asperity structure 50 inhibits reflection or total reflection on the second principal surface 22b and increases the light extraction efficiency of deep ultraviolet light output from the second principal surface 22b. The asperity structure 50 includes a plurality of cone-shaped parts 52 formed in an array on the light extraction surface and a plurality of granular parts 56 formed on the side part of the cone-shaped part 52. In this embodiment, the asperity structure 50 including a combination of the cone-shaped parts 52, which are relatively large projections, and the granular parts 56, which are relatively small projections, is formed. The asperity structure 50 is formed on substantially the entirety of the second principal surface 22b. In one variation, the asperity structure 50 may be formed only in a restricted area on the second principal surface 22b.

Figure 2:
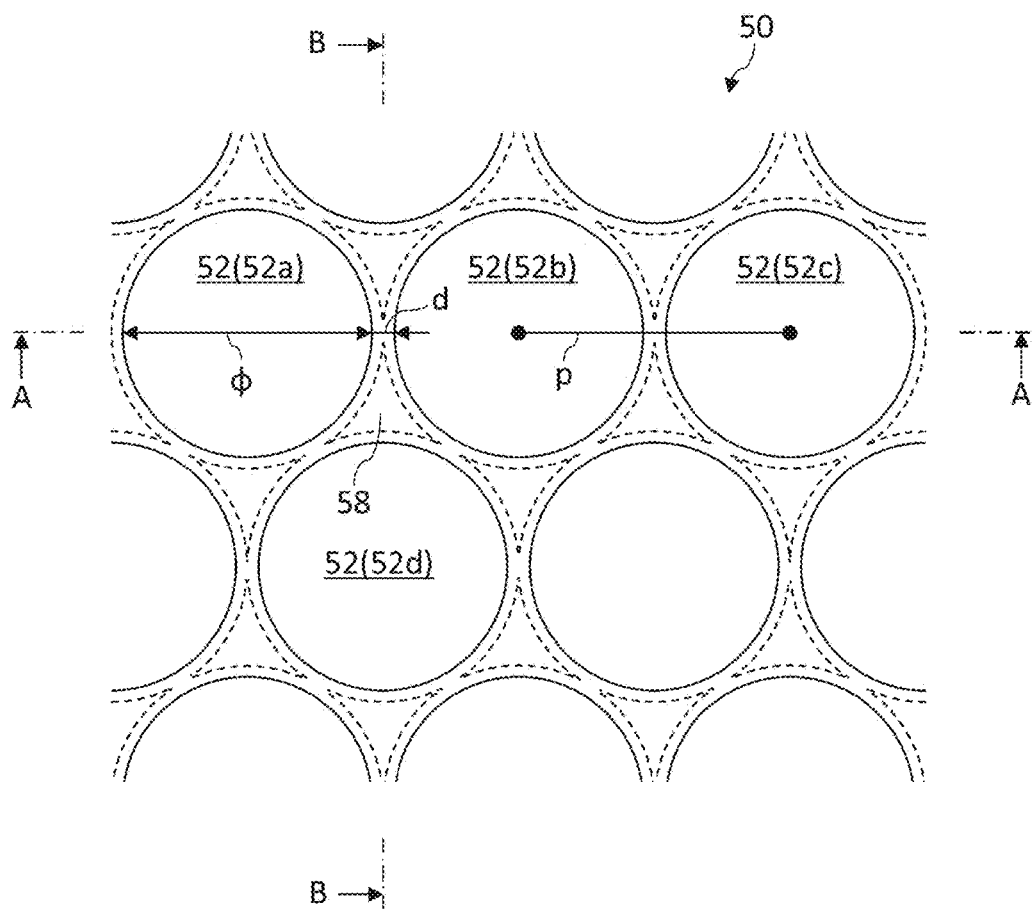
FIG. 2 is a top view schematically showing a configuration of the asperity structure.

FIG. 2 is a top view schematically showing a configuration of the asperity structure 50 and schematically shows an arrangement of the plurality of cone-shaped parts 52. In FIG. 2, illustration of the granular parts 56 is omitted to facilitate the understanding. The plurality of cone-shaped parts 52 are arranged in a triangular grid as shown. The cone-shaped parts 52 may be arranged in a quadrangular grid. The cone-shaped part 52 is made of the same material as the substrate 22. For example, the cone-shaped part 52 is made of sapphire ($Al_2O_3$) or aluminum nitride (AlN). In a plan view of the light extraction surface, the cone-shaped part 52 presents a conical shape with a circular outer profile. The cone-shaped part 52 need not have a completely circular outer profile and may have a substantially polygonal (e.g., hexagonal) outer profile. Therefore, the cone-shaped part 52 may have a shape similar to a polygonal pyramid like a hexagonal pyramid or may have a shape intermediate between a circular cone and a pyramid.

The cone-shaped parts 52 is formed such that the pitch p between adjacent cone-shaped parts 52 is not less than 100 nm and not more than 1000 nm, and, preferably, not less than 250 nm and not more than 600 nm. The pitch p of the cone-shaped parts 52 is defined as a distance between the apexes of adjacent cone-shaped parts 52 (e.g., 52b and 52c). The pitch p of the cone-shaped parts 52 may be determined with reference to the output wavelength λ. For example, the pitch may be not less than 0.5 times and not more than three times the output wavelength λ, and, preferably, not less than 0.8 times and not more than twice the output wavelength λ. Given that the output wavelength λ=280 nm, for example, the diameter φ of the cone-shaped part 52 may be not less than 140 nm and not more than 840 nm, or not less than 230 nm and not more than 560 hm. For example, the diameter φ of the cone-shaped part 52 may be about 250 nm, 300 nm, 350 nm, 400 nm, 450 nm, and 500 nm.

The cone-shaped parts 52 are formed such that diameter φ of the bottom of the cone-shaped part 52 is formed to be slightly smaller than the pitch p and a gap d is provided between two adjacent cone-shaped parts 52. The diameter φ of the cone-shaped part 52 is defined to be not less than 0.7 times and not more than 0.95 times the pitch p and, preferably, not less than 0.8 times and not more than 0.9 times the pitch p. Given that the pitch p of the cone-shaped parts 52 is 300 nm, for example, the diameter φ of the cone-shaped part 52 is defined to be not less than 210 nm and not more than 280 nm and, preferably, not less than 240 nm and not more than 270 nm. Therefore, the gap d between two adjacent cone-shaped parts 52 is defined to be not less than 20 nm and not more than 90 nm and, preferably, not less than 30 nm and not more than 60 nm.

Figure 4:
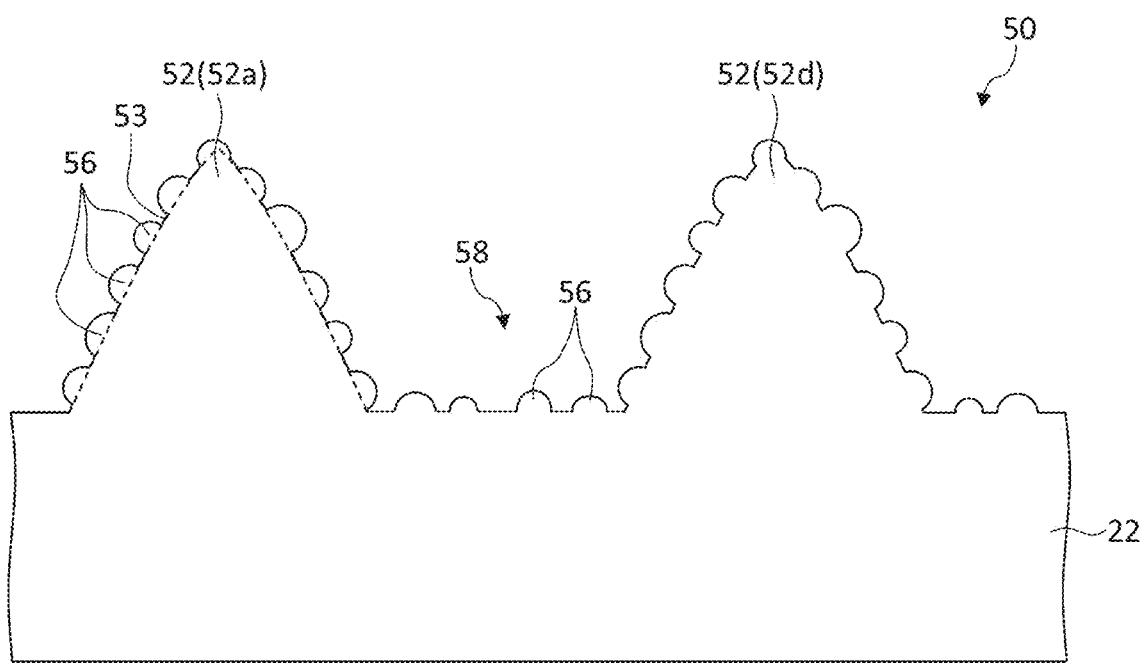
FIG. 4 is a cross-sectional view schematically showing a configuration of the asperity structure.

The light extraction surface is provided with a flat part 58 where the cone-shaped parts 52 are not formed. The flat part 58 is located in a space bounded by three cone-shaped parts 52 (e.g., 52a, 52b, and 52d) forming a triangular grid. In other words, the flat part 58 is a substantially triangular area bounded by adjacent three cone-shaped parts 52 in a plan view of the light extraction surface. The term flat part 58 denotes a location substantially parallel to a plane (c plane of the substrate 22) perpendicular to the direction of stack of the base structure 20 and the light emitting structure 30 and contrasted with an inclined portion such as the side part of the cone-shaped part 52. The flat part 58 is provided with the granular parts 56 as shown in FIG. 4 described later. Therefore, the term "flat part 58" does mean a completely flat surface but means a surface relatively flat as compared with relatively large projections like the cone-shaped parts 52.

The plurality of cone-shaped parts 52 are formed to occupy a certain proportion of the entire area in a plan view of the light extraction surface. The plurality of cone-shaped parts 52 are formed to occupy not less than 70% and not more than 85% of a unit area of the light extraction surface. Provided that the plurality of cone-shaped parts 52 are arranged in a hexagonal close packed pattern, the proportion of the area occupied by the cone-shaped parts 52 would be approximately 90%. However, the plurality of cone-shaped parts 52 are formed to occupy an area of a smaller proportion than in the case of hexagonal close packed arrangement. As a result, the gap d is provided between two adjacent cone-shaped parts 52, and the flat part 58 having a relatively larger area as compared with the case of hexagonal close packed arrangement is provided.

Figure 3:
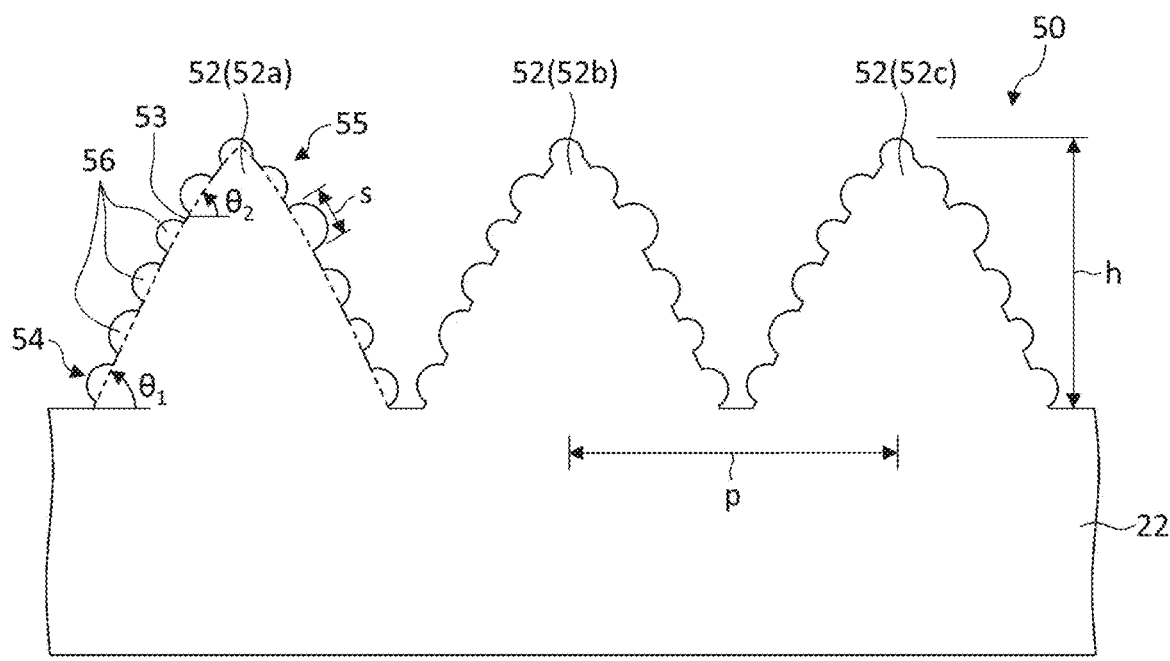
FIG. 3 is a cross-sectional view schematically showing a configuration of the asperity structure.

FIG. 3 is a cross-sectional view schematically showing a configuration of the asperity structure 50 and shows an A-A cross section of FIG. 2. As illustrated, the plurality of cone-shaped parts 52 (52a, 52b, 52c) are arranged at a predetermined pitch p. The plurality of cone-shaped parts 52 are formed to have a substantially uniform height h. The height h of the cone-shaped part 52 is not less than 0.5 times and not more than twice and, preferably, not less than 0.8 times and not more than 1.5 times the pitch p of the cone-shaped part 52. Given that the pitch p of the cone-shaped parts 52 is 300 nm, for example, the height h of the cone-shaped part 52 is not less than 150 nm and not more than 600 nm and, preferably, not less than 240 nm and not more than 400 nm.

In a plan view as illustrated, the cone-shaped part 52 is shaped such that the inclination of a side part 53 is smaller at an apex 55 than at the bottom 54. Comparing the angle of inclination $\theta_1$ near a bottom 54 of the side part 53 and the angle of inclination $\theta_2$ near the apex 55, the cone-shaped part 52 is shaped such that $\theta_1 > \theta_2$. In other words, the cone-shaped part 52 is shaped such that the inclination of the side part 53 is gentler near the apex 55, and the neighborhood of the apex 55 is more rounded in shape than a typical cone shape. As a result, the shape of the side part 53 of the cone-shaped part 52 is convexly curved outward from the cone-shaped part 52.

The plurality of granular parts 56 are formed on the side part 53 of the cone-shaped part 52. The granular parts 56 have a semispherical shape or a shape similar to a semisphere and are distributed over the entirety of the side part 53 of the cone-shaped part 52. The granular part 56 is made of the same material as that of the cone-shaped part 52 or a material that contains at least one of the elements forming the cone-shaped part 52. Given that the substrate 22 and the cone-shaped part 52 are made of sapphire or aluminum nitride, the granular part 56 is made of sapphire ($Al_2O_3$), aluminum nitride (AlN), aluminum (Al), a compound containing aluminum, or the like.

The average value of the grain size or diameter s of the granular part 56 is not less than 10 nm and not more than 90 nm and, preferably, not less than 20 nm and not more than 60 nm. The diameter s of the granular part 56 may be determined with reference to the output wavelength λ. For example, the diameter s may be defined to be not less than 0.05 times and not more than 0.3 times the output wavelength λ and, preferably, not less than 0.1 times and not more than 0.2 times the output wavelength λ. Given that the output wavelength λ=280 nm, for example, the average value of the diameter s of the granular part 56 is not less than 15 nm and not more than 80 nm and, preferably, not less than 30 nm and not more than 50 nm. The exemplary size of the granular part 56 indicated here serves as a guideline only and does not mean that the diameter s of each granular part 56 should be strictly accommodated in a predetermined range.

FIG. 4 is a cross-sectional view schematically showing a configuration of the asperity structure 50 and shows a B-B cross section of FIG. 2. In the cross-section shown in FIG. 4, the flat part 58 located in a space between adjacent cone-shaped parts 52 is included. As illustrated, the granular parts 56 are provided on the side part 53 of the cone-shaped part 52 and on the flat part 58. The granular parts 56 are formed on the flat part 58 in a distributed formation. The shape, size, and material of the granular part 56 formed on the flat part 58 are similar to those of the granular parts 56 formed on the side part 53 of the cone-shaped part 52.

Figure 5:
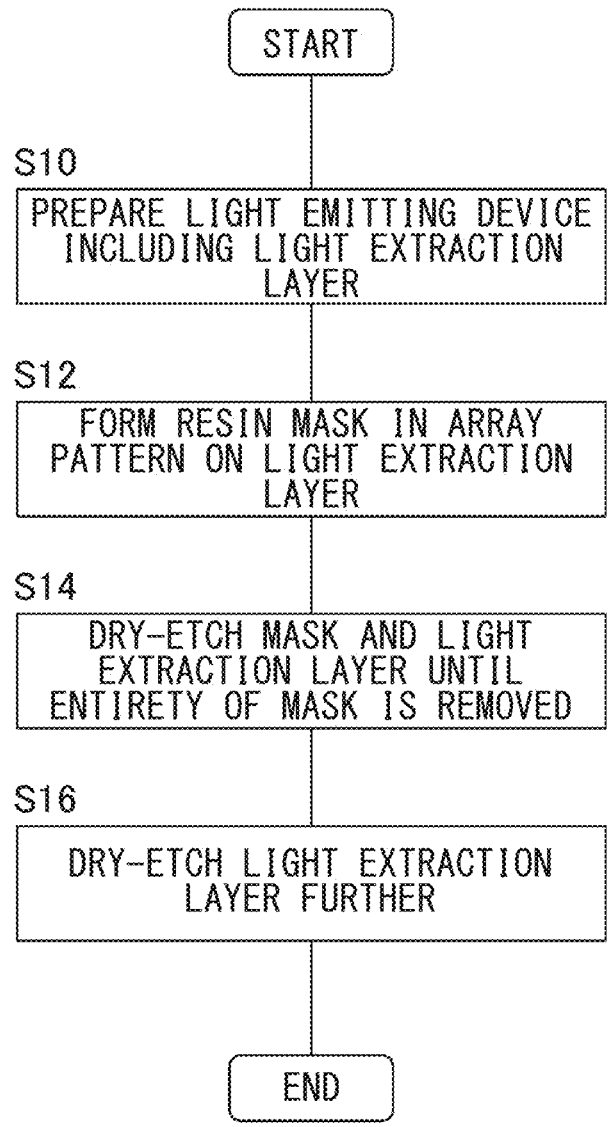
FIG. 5 is a flowchart showing a method of manufacturing the semiconductor light emitting device.

A description will now be given of a method of manufacturing the semiconductor light emitting device 10. FIG. 5 is a flowchart showing a method of manufacturing the semiconductor light emitting device 10. First, a light emitting device provided with a light extraction layer is prepared (S10), and a resin mask of an array pattern is formed on the light extraction layer (S12). Subsequently, a first dry-etching step is performed to dry-etch the mask and the light extraction layer from the above mask and etch the mask and the layer until the entirety of the mask is removed (S14). Subsequently, a second dry-etching step is performed to further dry-etch the light extraction surface after the mask is removed in the first dry-etching step (S16). In the embodiment, the first dry-etching step to remove the mask and the second dry-etching step to overetch the layer after the mask is removed are performed.

In the step of preparing the light emitting device, the substrate 22 not formed with the asperity structure 50 is prepared, and the first base layer 24, the second base layer 26, the n-type clad layer 32, the active layer 34, the electron block layer 36, the p-type clad layer 38, and the p-type contact layer 40 are stacked successively on the first principal surface 22a of the substrate 22. The second base layer 26, the n-type clad layer 32, the active layer 34, the electron block layer 36, the p-type clad layer 38, and the p-type contact layer 40 made of an AlGaN-based semiconductor material or a GaN-based semiconductor material can be formed by a well-known epitaxial growth method such as the metalorganic chemical vapor deposition (MOVPE) method and the molecular beam epitaxial (MBE) method.

Subsequently, portions of the active layer 34, the electron block layer 36, the p-type clad layer 38, and the p-type contact layer 40 stacked on the n-type clad layer 32 are removed to expose a partial region of the n-type clad layer 32. For example, portions of the active layer 34, the electron block layer 36, the p-type clad layer 38, and the p-type contact layer 40 may be removed by forming a mask, avoiding a partial region on the p-type contact layer 40, and performing reactive ion etching or dry etching using plasma, thereby exposing a partial region of the n-type clad layer 32.

The n-type contact layer 44 is then formed on the partial region of the n-type clad layer 32 exposed. The n-type contact layer 44 can be formed by a well-known epitaxial growth method such as the metalorganic chemical vapor deposition (MOVPE) method and the molecular beam epitaxial (MBE) method. Subsequently, the p-side electrode 42 is formed on the p-type contact layer 40, and the n-side electrode 46 is formed on the n-type contact layer 44. The metal layers forming the p-side electrode 42 and the n-side electrode 46 may be formed by a well-known method such as the MBE method.

The asperity structure 50 is then formed on the second principal surface 22b of the substrate 22. FIGS. 6-9 schematically show steps of manufacturing the asperity structure 50 and shows a step of processing a processed surface 60c of the light extraction layer 60 in which the asperity structure 50 has yet been formed. The light extraction layer 60 is a layer in which the light extraction surface should be formed and is a layer corresponding to the substrate 22 of the semiconductor light emitting device 10 shown in FIG. 1.

Figure 6:
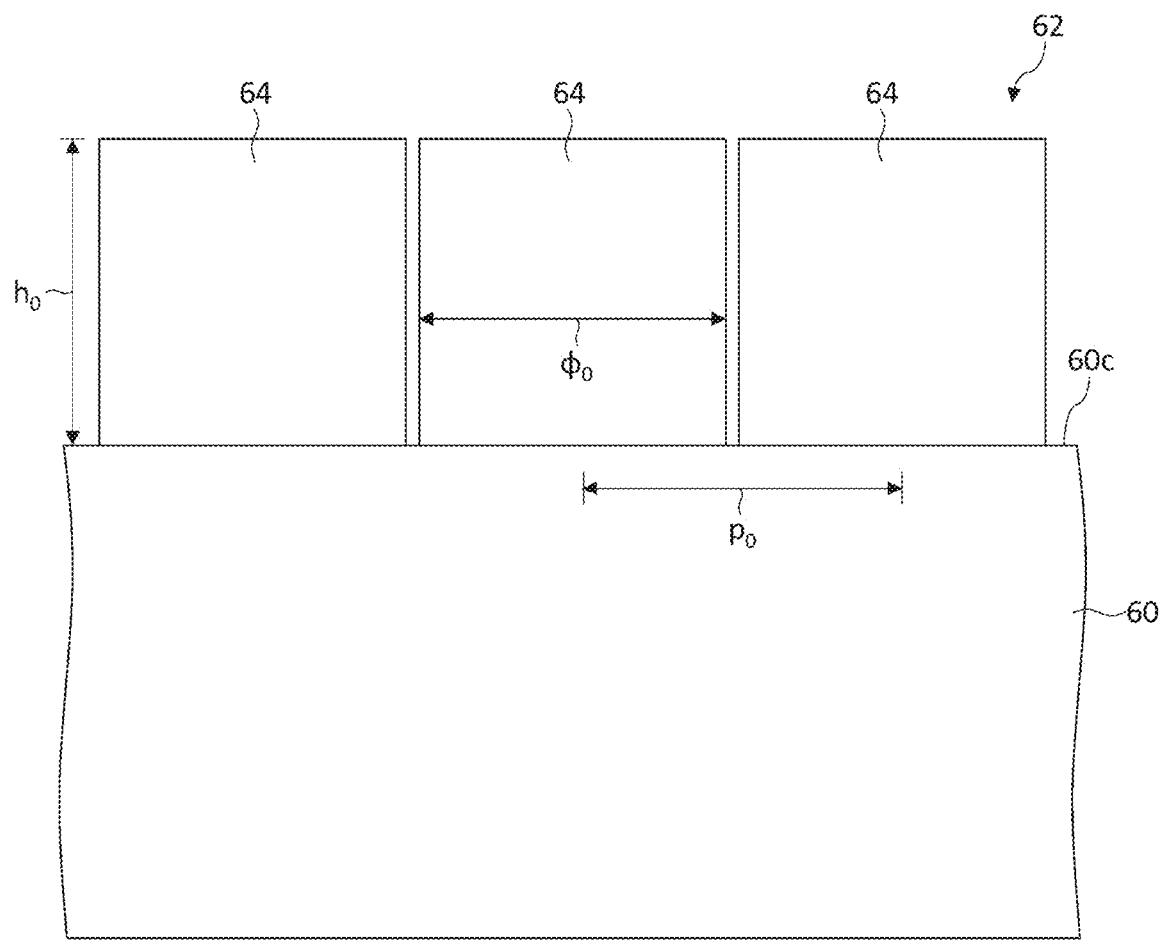
FIG. 6 schematically shows a step of manufacturing the asperity structure.

FIG. 6 shows a step of forming a mask 62 on the light extraction layer 60. For example, the processed surface 60c of the light extraction layer 60 is the (0001) plane (c plane) of the sapphire substrate. The mask 62 includes an array pattern corresponding to the cone-shaped parts 52 of the asperity structure 50 and includes a plurality of columns 64 arranged in an array. The plurality of columns 64 arranged in a triangular grid pattern, and each column has a prism or cylinder shape. For example, the column 64 may be a hexagonal prism. The column 64 may be provided with a slight taper angle and may be shaped in a truncated pyramid or a truncated cone. For example, the mask 62 is formed by a resist resin by using the nanoimprinting technology. The method of forming the mask 62 is not limited to any particular method, and the mask 62 may be formed by using a lithographic technology based on exposure or electron-beam printing.

The mask 62 is formed such that the pitch $p_0$ of adjacent columns 64 is identical to the pitch p of the cone-shaped parts 52. The height $h_0$ of the column 64 is determined based on the height h of the cone-shaped part 52 and the ratio between the etching rates of the light extraction layer 60 and the mask 62. Denoting the etching rate of the light extraction layer 60 by e and the etching of the mask 62 by $e_0$, the height h of the column 64 is determined by an expression $h_0 \approx h*e_0/e$. The height $h_0$ of the column 64 may be slightly larger than the value given by the above expression or larger than the value $h_0 \approx h*e_0/e$ by about 5%~15%. The diameter $\varphi_0$ of the column 64 is slightly smaller than the pitch $p_0$ of the columns 64 and is, for example, about 80%~95% of the pitch $p_0$.

A dry-etching process is then performed from above the mask 62. Reactive ion etching (RIE) may be used as a method of dry-etching the light extraction layer 60 and the mask 62. More specifically, plasma etching using inductive coupling plasma (ICP) may be used. The gas species used in plasma etching is not limited to any particular type, but it is preferred to use a chlorine-based gas such as chlorine ($Cl_2$) and boron trichloride ($BCl_3$). By using an etching gas like the above, it is possible to suitably etch sapphire or aluminum nitride forming the light extraction layer 60 and etch the resist resin forming the mask 62.

Figure 7:
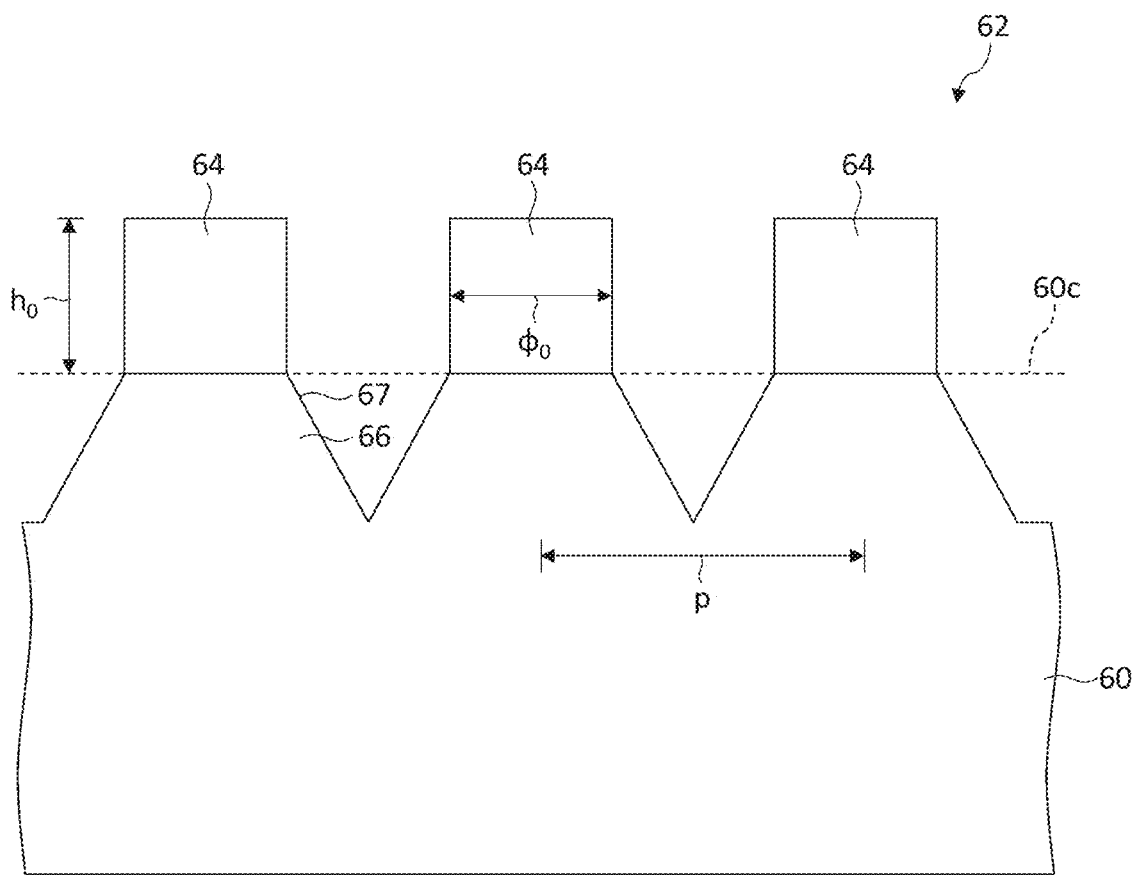
FIG. 7 schematically shows a step of manufacturing the asperity structure.

FIG. 7 schematically shows the dry-etched light extraction layer 60 and the mask 62 and shows a state in the middle of the first dry-etching step described above. In the first dry-etching step, the column 64 is isotropically etched from above and from side. As the etching step proceeds, the height $h_0$ and the diameter $\varphi_0$ of the column 64 grow smaller. Meanwhile, those portions of the light extraction layer 60 located below the mask 62 that are not covered with the mask 62 are etched. Since the covered area of the column 64 is reduced toward the center of the column 64 with time, the area of the light extraction layer 60 that is etched grows larger with time. As a result, the etching volume in the direction of depth of the light extraction layer 60 varies depending on the distance from the center of the column 64 with the result that a projection 66 having an inclined surface 67 and similar to a truncated cone or a truncated pyramid is formed below the mask 62. The projection 66 is formed at a position corresponding to the array pattern of the mask 62 and is formed in a position corresponding to each of the plurality of columns 64.

Figure 8:
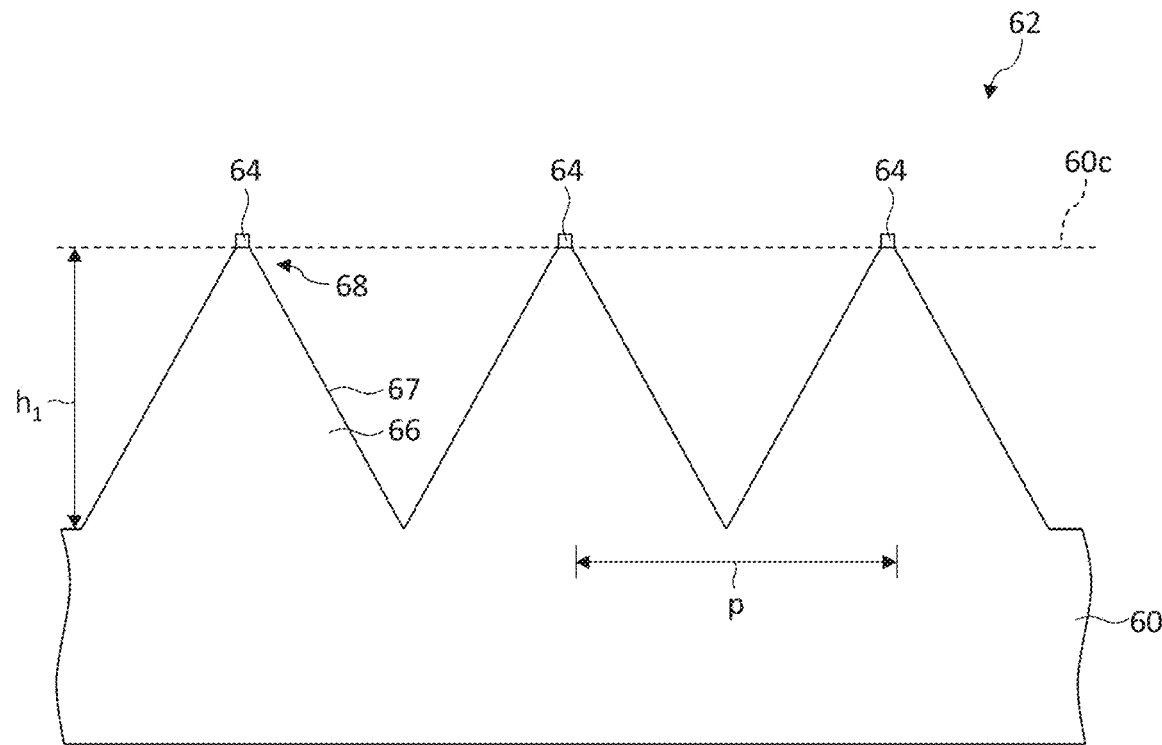
FIG. 8 schematically shows a step of manufacturing the asperity structure.

FIG. 8 schematically shows the dry-etched light extraction layer 60 and the mask 62 and shows a state that occurs immediately before the first dry-etching step is terminated. As the dry-etching step is allowed to proceed from the state shown in FIG. 7, the column 64 grows even smaller, and the entirety of the mask 62 is ultimately removed from the light extraction layer 60. The light extraction layer 60 is etched such that the width (diameter) of the apex 68 of the projection 66 becomes even smaller. As a result, the projection 66 having a pointed apex 68 and similar to a circular cone or a pyramid in shape is formed. The height $h_1$ of the projection 66 corresponds to the etching volume (also called the first etching volume) in the direction of depth by which the light extraction layer 60 is etched in the first dry-etching step and is given by an expression $h_1 = h_0*e/e_0$, where h0 denotes the initial height of the mask 62, e denotes the etching rate of the light extraction layer 60, and $e_0$ denotes the etching rate of the mask 62.

In the embodiment, the second dry-etching step for dry-etching the light extraction layer 60 further is performed after the entirety of the mask 62 is removed in the first dry-etching step. The second dry-etching step is a step with substantially the same etching condition as the first dry-etching step and is performed in continuation of the first dry-etching step. In other words, the second dry-etching step is performed to follow the first dry-etching step while the light emitting device remains housed in the etching process chamber. In one variation, the second dry-etching step may be performed in isolation from the first dry-etching step, or a certain addition process may be performed between the first dry-etching step and the second dry-etching step. Further, the processing conditions of the first dry-etching step and the second dry-etching step may differ. For example, processing conditions like etching gas, etching rate, etc. may differ.

Figure 9:
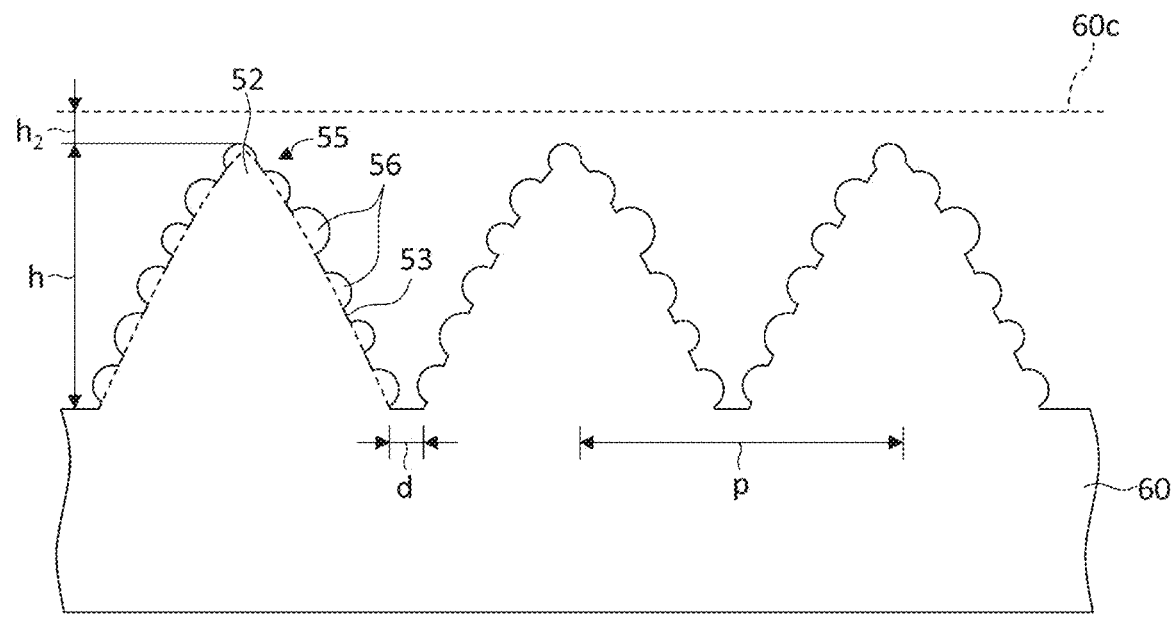
FIG. 9 schematically shows a step of manufacturing the asperity structure.

FIG. 9 schematically shows the dry-etched light extraction layer 60 and shows a state that occurs when the cone-shaped parts 52 and the granular parts 56 are formed by performing the second dry-etching step. The second dry-etching step is performed in the absence of the mask 62 and is a so-called maskless, free-running dry-etching process. In the second dry-etching step, the reaction product produced by dry-etching is randomly attached to the surface of the light extraction layer 60, or the etching volume varies depending on the location due to the unevenness of the microscopic composition of the light extraction layer 60. As a result, the granular parts 56 are formed on the side part 53 of the cone-shaped part 52, and micro-asperities are formed on the side part 53. This is in contrast to the inclined surface 67 shown in FIG. 8 having a low surface roughness.

In the second dry-etching step, maskless etching is performed, and the gap d is formed between adjacent cone-shaped parts 52. Also, the flat part 58 (see FIG. 2) located in a space between three adjacent cone-shaped parts 52 is formed, and the flat part 58 is also formed with granular parts 56 (see FIG. 4). When the second dry-etching step is started, the apex 68 of the projection 66 is pointed so that the electric field applied during plasma etching tends to be concentrated on the apex 68, causing the etching rate near the apex 68 to be relatively high. As a result, the neighborhood of the apex 68 is etched more heavily, resulting in a rounded shape of the apex 55 of the cone-shaped part 52 as formed.

The processing time and etching volume of the second dry-etching step are less than those of the first dry-etching step. For example, the etching volume (also called the second etching volume) in the direction of depth by which the light extraction layer 60 is etched in the second dry-etching step is conditioned to be not less than 10% and not more than 20% of the first etching volume in the first dry-etching step. The second etching volume in the second dry-etching step corresponds to the height $h_2$ from the processed surface 60c on which the mask 62 was formed as far as the apex 55 of the cone-shaped part 52. Given that the etching rate of the first dry-etching step and that of the second etching step are identical, the second dry-etching time for which the second dry-etching step is performed is not less than 10% and not more than 20% the first dry-etching time for which the first dry-etching step is performed. By controlling the second dry-etching step in this way, it is ensured that the proportion of the area occupied by the cone-shaped parts 52 is not less than 70% and not more than 85% and that the granular parts 56 are formed on the side part 53 of the cone-shaped part 52 in a distributed formation.

Figure 10A:
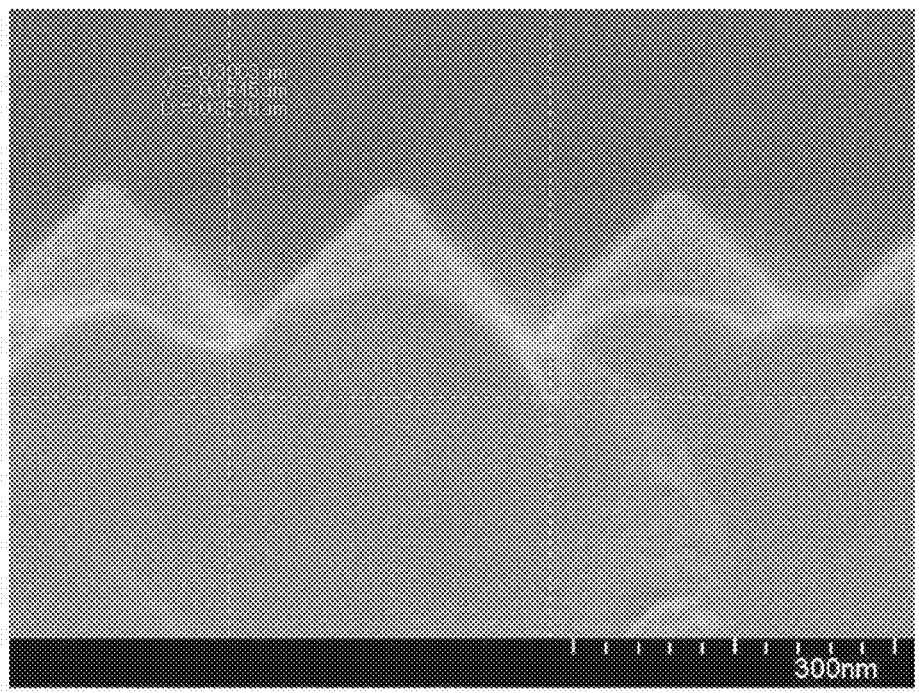
FIGS. 10A and 10B show electron microscope images of the asperity structure formed in the first dry-etching step.
Figure 10B:
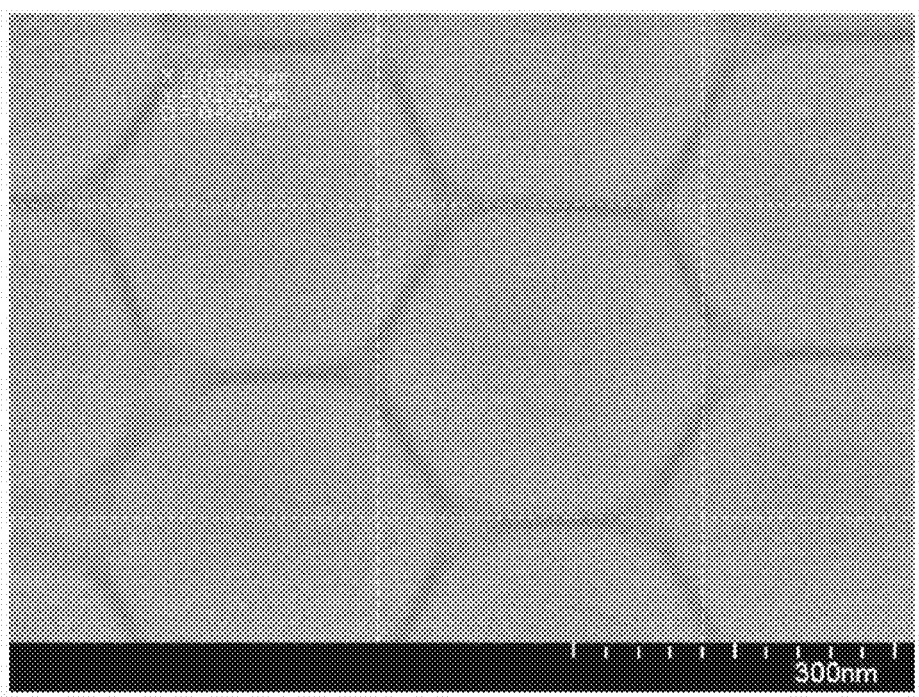

FIGS. 10A and 10B show electron microscope images of the asperity structure formed in the first dry-etching step according one example. FIG. 10A is a cross-sectional view and FIG. 10B is a top view. The figures show a state after the first dry-etching step and corresponding to the state shown in FIG. 8. In the example shown, the pitch is configured such that p=300 nm. As shown in the figures, it is known that the surface roughness of the inclined surface of the conical or pyramidal projection is low and the surface is relatively flat in the state after the first dry-etching step.

Figure 11A:
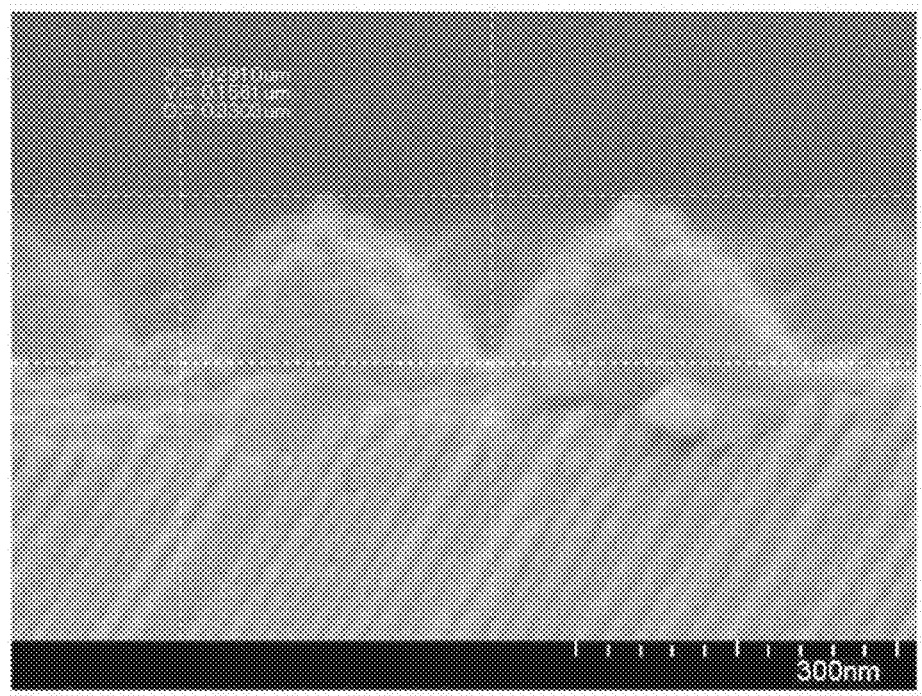
FIGS. 11A and 11B are electron microscopic images showing the asperity structure formed in the second dry-etching step.
Figure 11B:
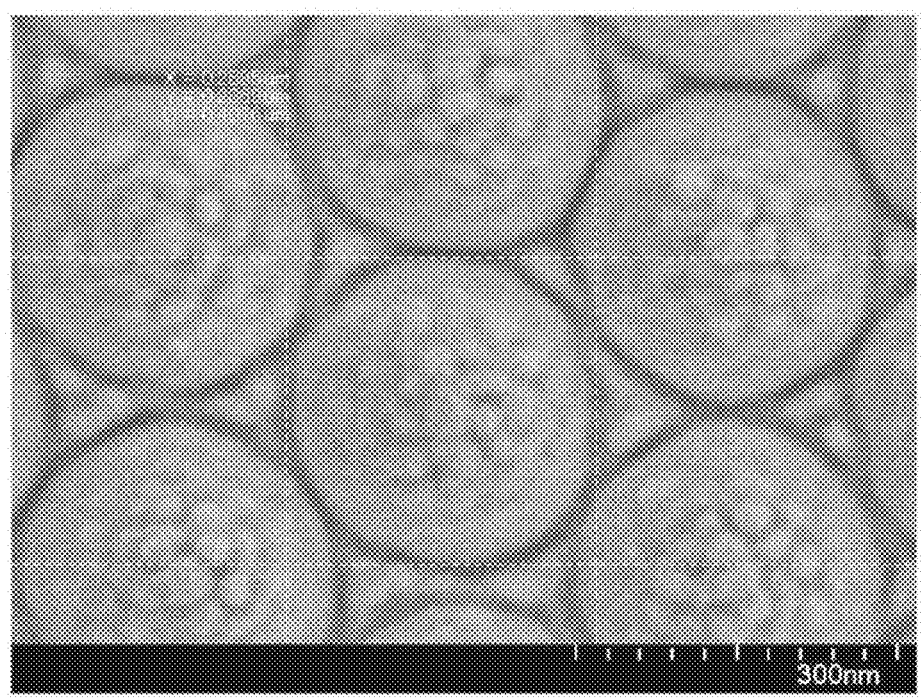

FIGS. 11A and 11B are electron microscopic images showing the asperity structure formed in the second dry-etching step according to one example. FIG. 11A is a cross-sectional view and FIG. 11B is a top view. The figures show a state after the second dry-etching step and corresponding to the state shown in FIG. 9. As shown in the figures, it is known that the granular parts are formed in a distribution formation on the side part of the cone-shaped part in the state after the second dry-etching step. It is also known that the granular part is also formed in the flat part located in a space between three adjacent cone-shaped parts. This is in contrast with the asperity structure shown in FIGS. 10A and 10B.

A description will now be given of the advantage provided by the embodiment. To quantify the advantage of the asperity structure 50 according to the embodiment, two comparative examples that differ in the structure of the light extraction surface are fabricated. In comparative example 1, the second principal surface 22b of the substrate 22 is not formed with the asperity structure and is maintained as a flat surface. In comparative example 2, the asperity structure comprised only of an array of cone-shaped parts is formed on the second principal surface 22b of the substrate 22. The light extraction surface according to comparative example 2 corresponds to FIGS. 10A and 10B. In the embodiment, the asperity structure 50 comprised of a combination of the cone-shaped parts 52 and the granular parts 56 is formed on the second principal surface 22b of the substrate 22. The light extraction surface according to the embodiment corresponds to FIGS. 11A and 11B. A comparison of the output intensity from the light extraction surfaces revealed that comparative example 2 exhibits an improvement of about 22% in output intensity over comparative example 1, and the embodiment exhibits an improvement of about 32% in output intensity over comparative example 1. This demonstrates that the efficiency of light extraction from the light extraction surface is further improved by forming the granular parts 56 both on the side part 53 of the cone-shaped parts 52 and on the flat part 58 located in a space between adjacent cone-shaped parts 52 as well as forming an array of the cone-shaped parts 52 on the light extraction surface.

According to the embodiment, only one type of mask need be used to form a structure including a combination of the cone-shaped parts 52 and the granular parts 56 so that the manufacturing steps are simplified, and the manufacturing cost is reduced. In the related art, an attempt to form a combination of asperity shapes having different sizes requires application of a plurality of types of masks suited to the sizes of the asperities sought to be formed and so requires the number of steps corresponding to the number of types of masks used. Meanwhile, according to the embodiment, only one type of mask need be used, and the first dry-etching step and the second dry-etching step may be performed continuously. Therefore, the number manufacturing steps is reduced. Thus, according to the embodiment, the light extraction efficiency of the semiconductor light emitting device 10 is improved, while also preventing the manufacturing cost from being increased.

Described above is an explanation based on an exemplary embodiment. The embodiment is intended to be illustrative only and it will be understood by those skilled in the art that various design changes are possible and various modifications are possible and that such modifications are also within the scope of the present invention.

Figure 12:
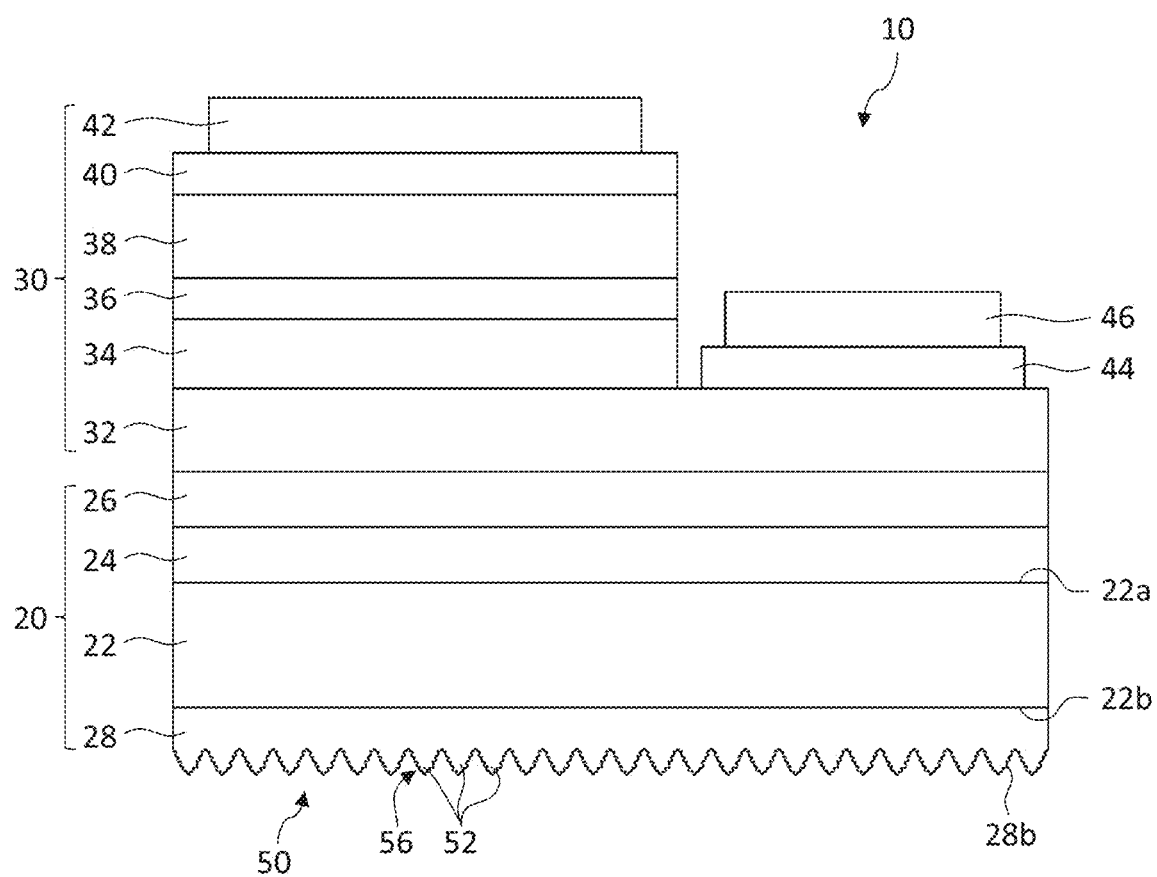
FIG. 12 is a cross-sectional view schematically showing a configuration of the semiconductor light emitting device according to a variation.

FIG. 12 is a cross-sectional view schematically showing a configuration of the semiconductor light emitting device 10 according to a variation. In this variation, a third base layer 28 is further provided on the base structure 20, and the asperity structure 50 is formed on a light extraction surface 28b that is the principal surface of the third base layer 28. The following description of the variation highlights the difference from the embodiment described above.

The base structure 20 includes a substrate 22, a first base layer 24, a second base layer 26, and a third base layer 28. The substrate 22 includes a first principal surface 22a and a second principal surface 22b that are flat surfaces. The third base layer 28 is provided on the second principal surface 22b of the substrate 22. Therefore, the third base layer 28 is provided opposite to the light emitting structure 30, sandwiching the substrate 12. The third base layer 28 functions as the light extraction layer.

The third base layer 28 is made of a material having a lower refractive index than the active layer 34 and a higher refractive index than the substrate 22 for the wavelength of the deep ultraviolet light emitted by the active layer 34. Given that the substrate 22 is a sapphire substrate (the refractive index $n_1$=about 1.8) and the active layer 34 is a made of an AlGaN-based semiconductor material (the refractive index $n_3$=about 2.4~2.6), it is desirable that the third base layer 28 be made of AlN (the refractive index $n_4$=about 2.1) or an AlGaN-based semiconductor material having a relatively higher AlN composition ratio (the refractive index $n_4$=about 2.2~2.3). The third base layer 28 may be made of silicon nitride (SiN, the refractive index $n_4$=about 1.9~2.1), silicon oxynitride (SiON), or silicon oxide ($SiO_2$). It is preferred that the third base layer 28 have a high transmittance for the deep ultraviolet light emitted by the active layer 34 and be configured to have an internal transmittance of 90% or higher.

The third base layer 28 is made of an undoped AlGaN-based semiconductor material or AlN and can be formed by a well-known epitaxial growth method such as the metalorganic chemical vapor deposition (MOVPE) method and the molecular beam epitaxial (MBE) method. The third base layer 28 may be formed after the first base layer 24, the second base layer 26, and the light emitting structure 30 are formed on the first principal surface 22a of the substrate 22 or before the layers are formed on the first principal surface 22a of the substrate 22. The third base layer 28 may be formed concurrently with the step of forming the first base layer 24 or the second base layer 26. According to this variation, the impact from total reflection produced at the light extraction surface 28b is further mitigated by providing the third base layer 28 having a higher refractive index than the substrate 22 on the second principal surface 22b of the substrate 22.

In the embodiment and the variations, a description is given of a case of forming the asperity structure 50 on the light extraction layer after the light emitting structure 30 is formed. In a further variation, the light emitting structure 30 may be formed after the asperity structure 50 is formed on the light extraction layer. For example, the substrate 22 on which the asperity structure 50 is formed in advance may be prepared, and the light emitting structure 30 may be formed on the substrate.

In the embodiment and the variations, a description is given of a case of forming the asperity structure 50 in the semiconductor light emitting device 10 for outputting deep ultraviolet light. In a further variation, the asperity structure 50 described above may be applied to a semiconductor light emitting device for outputting light other than deep ultraviolet light. For example, the asperity structure 50 may be applied to a light emitting device for outputting ultraviolet light of 360 nm~400 nm or a light emitting device for outputting blue light of 400 nm~450 nm. Further, the asperity structure 50 may be applied to a light emitting device for outputting visible light such as green light, yellow light, and red light or to a light emitting device for outputting infra-red light.

It should be understood that the invention is not limited to the above-described embodiment but may be modified into various forms on the basis of the spirit of the invention. Additionally, the modifications are included in the scope of the invention.

What is claimed is:

1. A method of manufacturing a semiconductor light emitting device including a light extraction layer having a light extraction surface, comprising:
   forming a mask having an array pattern on the light extraction layer; and
   etching the mask and the light extraction layer from above the mask, wherein
   the etching includes first dry-etching performed until an entirety of the mask is removed and second dry-etching performed in maskless to further dry-etch the light extraction layer after the mask is removed, and
   the second dry-etching step is performed in continuation of the first dry-etching step while the light emitting device remains housed in an etching process chamber.

2. The method of manufacturing the semiconductor light emitting device according to claim 1, wherein
   in the first dry-etching step, a plurality of cone-shaped parts arranged in an array to correspond to the pattern of the mask are formed on the light extraction surface, and
   in the second dry-etching step, a plurality of granular parts are formed both on a side part of the plurality of cone-shaped parts and on a flat part located in a space between adjacent cone-shaped parts.

3. The method of manufacturing the semiconductor light emitting device according to claim 1, wherein
   a second etching volume in a direction of depth by which the light extraction layer is etched in the second dry-etching is not less than 10% and not more than 20% a first etching volume in the direction of depth by which the light extraction layer is etched in the first dry-etching.

4. The method of manufacturing the semiconductor light emitting device according to claim 1, wherein
   an etching rate of the second dry-etching is the same as an etching rate of the first dry-etching, and
   a second dry-etching time for which the second dry-etching is performed is not less than 10% and not more than 20% a first dry-etching time for which the first dry-etching is performed.

5. The method of manufacturing the semiconductor light emitting device according to claim 1, wherein the semiconductor light emitting device includes: a base structure that includes at least one of a sapphire ($Al_2O_3$) layer and an aluminum nitride (AlN) layer; and a light emitting structure that is formed on the base structure and includes an aluminum gallium nitride (AlGaN)-based semiconductor layer for emitting deep ultraviolet light, and the light extraction layer is the sapphire layer, the AlN layer, or a silicon oxide ($SiO_2$) layer of the base structure.

6. The method of manufacturing the semiconductor light emitting device according to claim 1, wherein chlorine ($Cl_2$) or boron trichloride ($BCl_3$), which does not contain carbon (C), is used as an etching gas in the etching.

7. The method of manufacturing the semiconductor light emitting device according to claim 1, wherein the mask includes a plurality of columns arranged in the array pattern, each of the plurality of columns having a uniform width in a direction perpendicular to a height direction and being made of a resin.

* * * * *